US011484911B2

(12) United States Patent
Miao et al.

(10) Patent No.: US 11,484,911 B2
(45) Date of Patent: Nov. 1, 2022

(54) BOTTOM ELECTRODE VIA STRUCTURES FOR MICROMACHINED ULTRASONIC TRANSDUCER DEVICES

(71) Applicant: BFLY Operations, Inc., Guilford, CT (US)

(72) Inventors: Lingyun Miao, Fremont, CA (US); Jianwei Liu, Fremont, CA (US)

(73) Assignee: BFLY Operations, Inc., Guilford, CT (US)

( * ) Notice: Subject to any disclaimer, the term of this patent is extended or adjusted under 35 U.S.C. 154(b) by 321 days.

(21) Appl. No.: 16/844,857

(22) Filed: Apr. 9, 2020

(65) Prior Publication Data

US 2020/0324319 A1 Oct. 15, 2020

Related U.S. Application Data

(60) Provisional application No. 62/833,625, filed on Apr. 12, 2019.

(51) Int. Cl.
*B06B 1/00* (2006.01)
*B06B 1/02* (2006.01)
(Continued)

(52) U.S. Cl.
CPC .......... *B06B 1/0292* (2013.01); *B81B 3/0021* (2013.01); *B81C 1/00158* (2013.01);
(Continued)

(58) Field of Classification Search
CPC ... B06B 1/0292; B06B 1/0622; B81B 3/0021; B81B 2201/0271; B81B 2203/0127;
(Continued)

(56) References Cited

U.S. PATENT DOCUMENTS 6,430,109 B1  8/2002 Khuri-Yakub et al.
6,694,817 B2  2/2004 Degertekin et al.
(Continued)

FOREIGN PATENT DOCUMENTS

WO  WO 2013/049794 A1  4/2013
WO  WO 2016/011000     1/2016

OTHER PUBLICATIONS

Gurun et al., Front-end CMOS Electronics for Monolithic Integration with CMUT Arrays: Circuit Design and Initial Experimental Results. IEEE International Ultrasonics Symposium Proceedings. 2008:390-3.

(Continued)

*Primary Examiner* — Matthew A Eason
(74) *Attorney, Agent, or Firm* — Osha Bergman Watanabe & Burton LLP

(57) ABSTRACT

A ultrasonic transducer device includes a transducer bottom electrode layer disposed over a substrate, and a plurality of vias that electrically connect the bottom electrode layer with the substrate, wherein substantially an entirety of the plurality of vias are disposed directly below a footprint of a transducer cavity. Alternatively, the transducer bottom electrode layer includes a first metal layer in contact with the plurality of vias and a second metal layer formed on the first metal layer, the first metal layer including a same material as the plurality of vias.

8 Claims, 16 Drawing Sheets

(51) Int. Cl.
*B81B 3/00* (2006.01)
*B81C 1/00* (2006.01)

(52) U.S. Cl.
CPC .............. *B81B 2201/0271* (2013.01); *B81B 2203/0127* (2013.01); *B81B 2203/04* (2013.01); *B81B 2207/015* (2013.01); *B81B 2207/07* (2013.01); *B81C 2201/013* (2013.01); *B81C 2201/0125* (2013.01); *B81C 2203/036* (2013.01); *B81C 2203/0735* (2013.01)

(58) Field of Classification Search
CPC .......... B81B 2203/04; B81B 2207/015; B81B 2207/07; B81B 7/0006; B81C 1/00158; B81C 2201/0125; B81C 2201/013; B81C 2203/036; B81C 2203/0735
See application file for complete search history.

(56) References Cited

U.S. PATENT DOCUMENTS

| | | |
|---|---|---|
| 6,779,387 B2 | 8/2004 | Degertekin |
| 6,958,255 B2 | 10/2005 | Khuri-Yakub et al. |
| 7,615,834 B2 | 11/2009 | Khuri-Yakub et al. |
| 7,846,102 B2 | 12/2010 | Kupnik et al. |
| 8,241,931 B1 | 8/2012 | Antoine et al. |
| 8,402,831 B2 | 3/2013 | Kupnik et al. |
| 9,067,779 B1 | 6/2015 | Rothberg et al. |
| 9,242,275 B2 | 1/2016 | Rothberg et al. |
| 9,319,800 B2 | 4/2016 | Hong et al. |
| 9,499,392 B2 | 11/2016 | Rothberg et al. |
| 9,505,030 B2 | 11/2016 | Rothberg et al. |
| 9,533,873 B2 | 1/2017 | Rothberg et al. |
| 9,938,134 B2 | 4/2018 | Lin et al. |
| 2004/0141421 A1 | 7/2004 | Cheng et al. |
| 2007/0215964 A1 | 9/2007 | Khuri-Yakub et al. |
| 2009/0140609 A1 | 6/2009 | Huang |
| 2010/0225200 A1 | 9/2010 | Kupnik et al. |
| 2011/0018398 A1 | 1/2011 | Fukuda |
| 2011/0050045 A1 | 3/2011 | Aratake et al. |
| 2011/0055447 A1 | 3/2011 | Costa |
| 2011/0115333 A1 | 5/2011 | Ezaki |
| 2013/0135056 A1 | 5/2013 | Allegato et al. |
| 2014/0206123 A1* | 7/2014 | Chu .................. B81C 1/00269 438/51 |
| 2014/0264660 A1 | 9/2014 | Rothberg et al. |
| 2016/0009544 A1 | 1/2016 | Rothberg et al. |
| 2016/0043660 A1 | 2/2016 | Wang et al. |
| 2017/0232474 A1 | 8/2017 | Oralkan et al. |
| 2018/0243792 A1 | 8/2018 | Rothberg et al. |
| 2018/0369862 A1 | 12/2018 | Alie et al. |
| 2018/0376253 A1 | 12/2018 | Lutsky et al. |
| 2019/0047850 A1 | 2/2019 | Rothberg et al. |
| 2019/0142387 A1 | 5/2019 | Chen et al. |
| 2019/0160490 A1 | 8/2019 | Alie et al. |
| 2019/0231312 A1 | 8/2019 | Fife et al. |
| 2019/0261954 A1 | 8/2019 | Chen et al. |
| 2019/0261955 A1 | 8/2019 | Chen et al. |
| 2019/0275561 A1 | 9/2019 | Fife et al. |
| 2019/0336099 A1 | 11/2019 | Fife et al. |
| 2019/0336103 A1 | 11/2019 | Fife et al. |
| 2019/0336104 A1 | 11/2019 | Fife et al. |
| 2019/0382258 A1* | 12/2019 | Lee .................... B81C 1/00301 |
| 2020/0013691 A1 | 1/2020 | Liu et al. |
| 2020/0102214 A1 | 4/2020 | Liu et al. |

OTHER PUBLICATIONS

International Search Report and Written Opinion dated Jul. 13, 2020 in connection with International Application No. PCT/US2020/027437.

International Search Report and Written Opinion dated Jul. 13, 2020 in connection with International Application No. PCT/US2020/027457.

International Search Report and Written Opinion dated Dec. 16, 2019 in connection with International Application No. PCT/US2019/053352.

International Preliminary Report on Patentability dated Apr. 8, 2021 in connection with International Application No. PCT/Us2019/053352.

Daft et al., Microfabricated ultrasonic transducers monolithically integrated with high voltage electronics. Proc Ultrason Symp. 2004;493-6.

Kupnik et al., CMUT Fabrication Based on a Thick Buried Oxide Layer. Proc IEEE Ultrason Symp. Oct. 2010;2010:547-550. doi:10.1109/ULTSYM.2010.5935935. Epub Jun. 8, 2012. 10 pages.

Kupnik et al., Wafer-Bonded CMUT Meets CMOS. 2010 CMOS Emerging Technology Workshop. May 21, 2010;1-22.

* cited by examiner

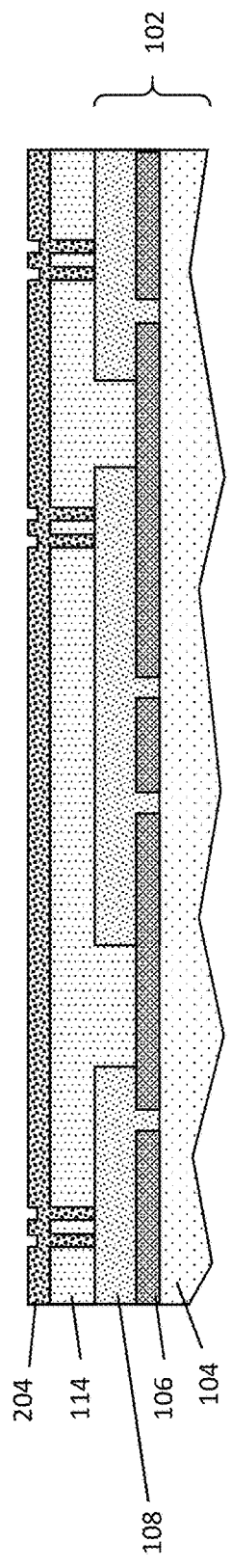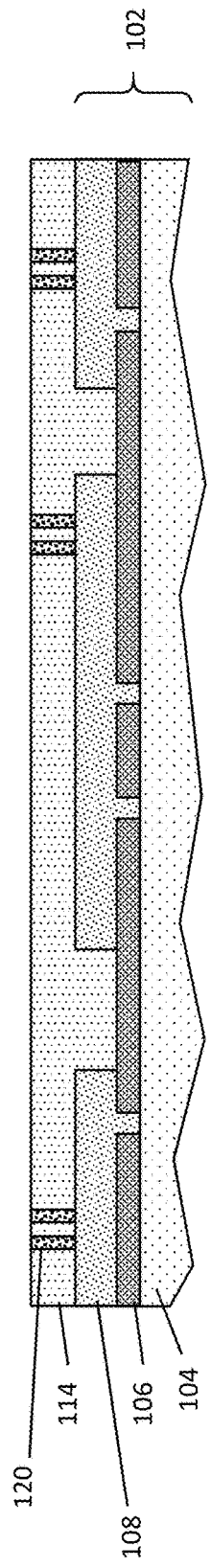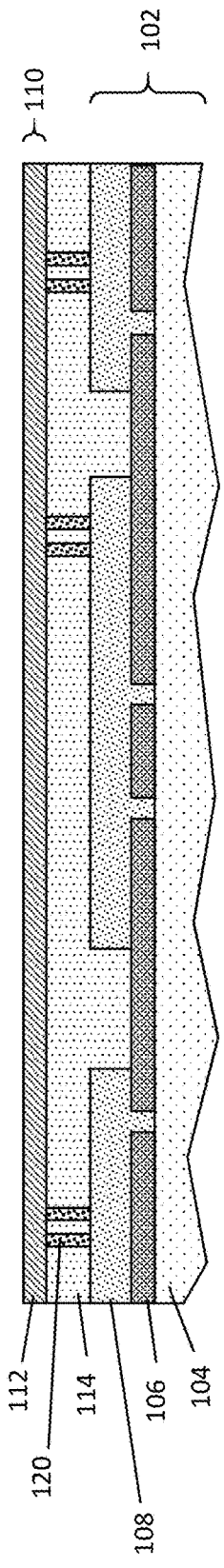

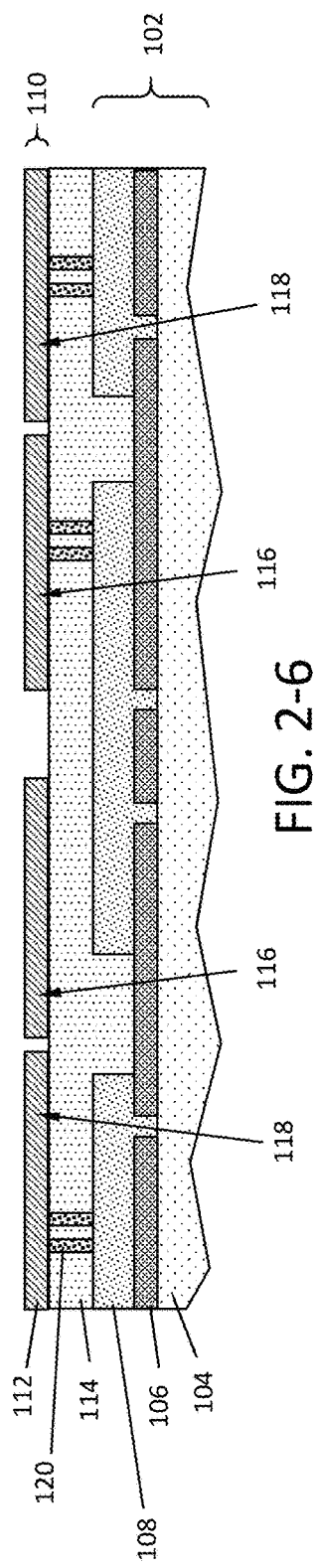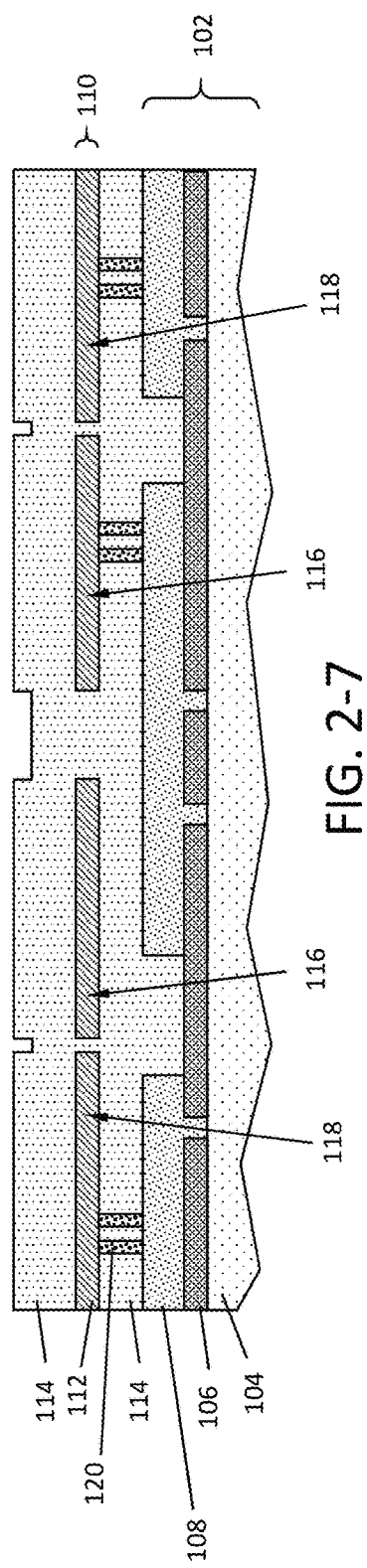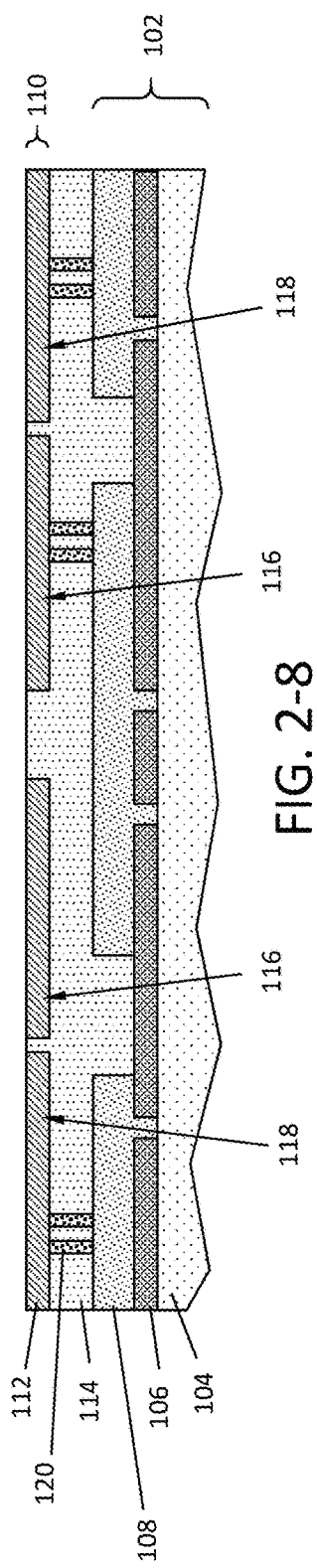

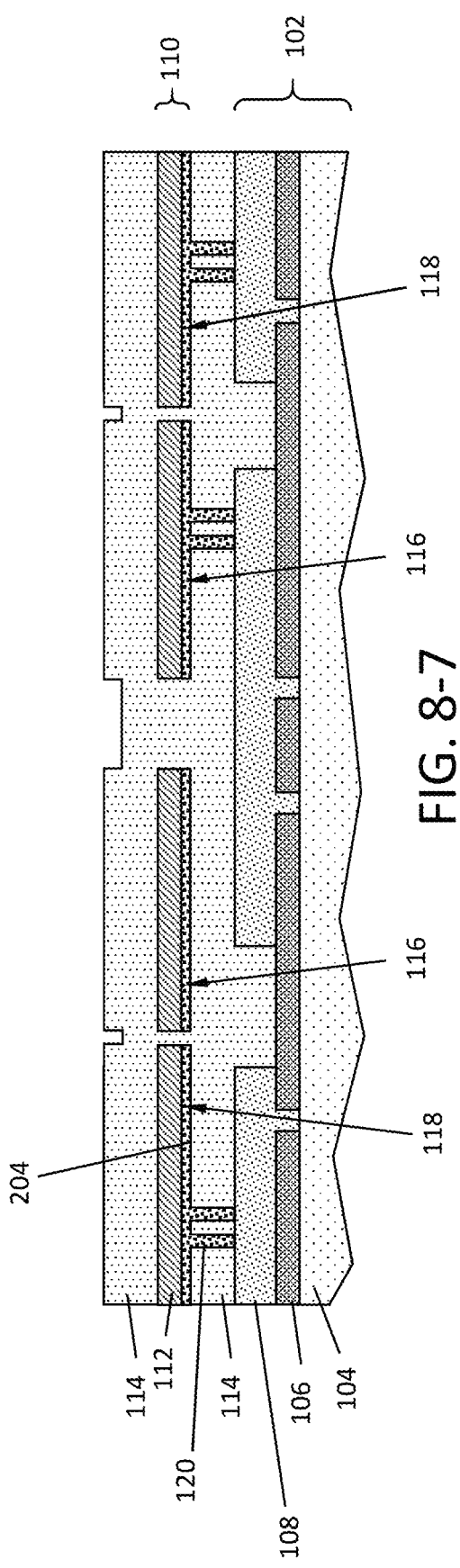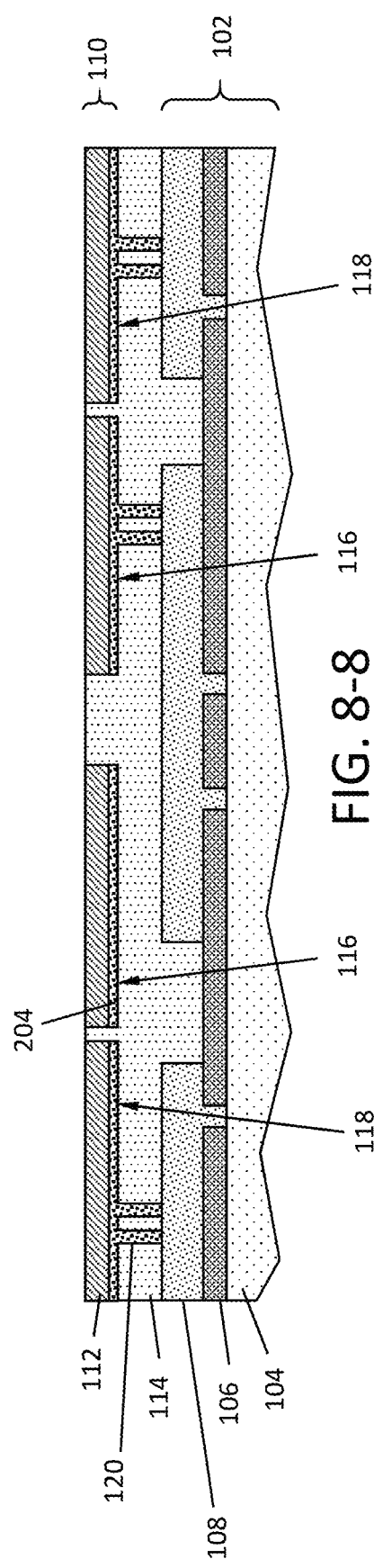

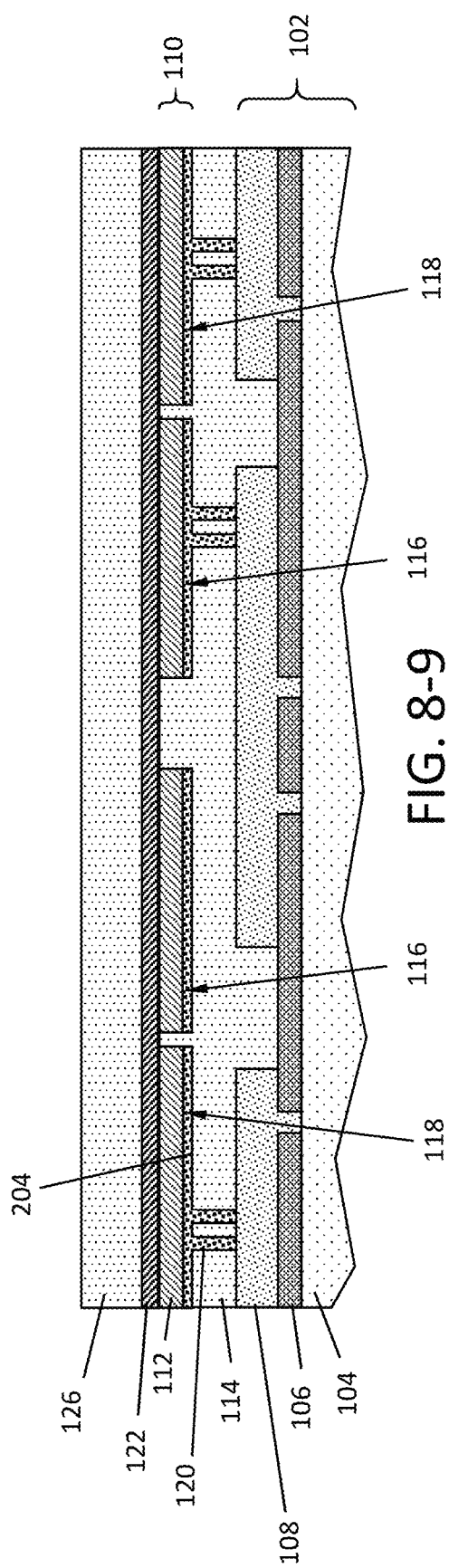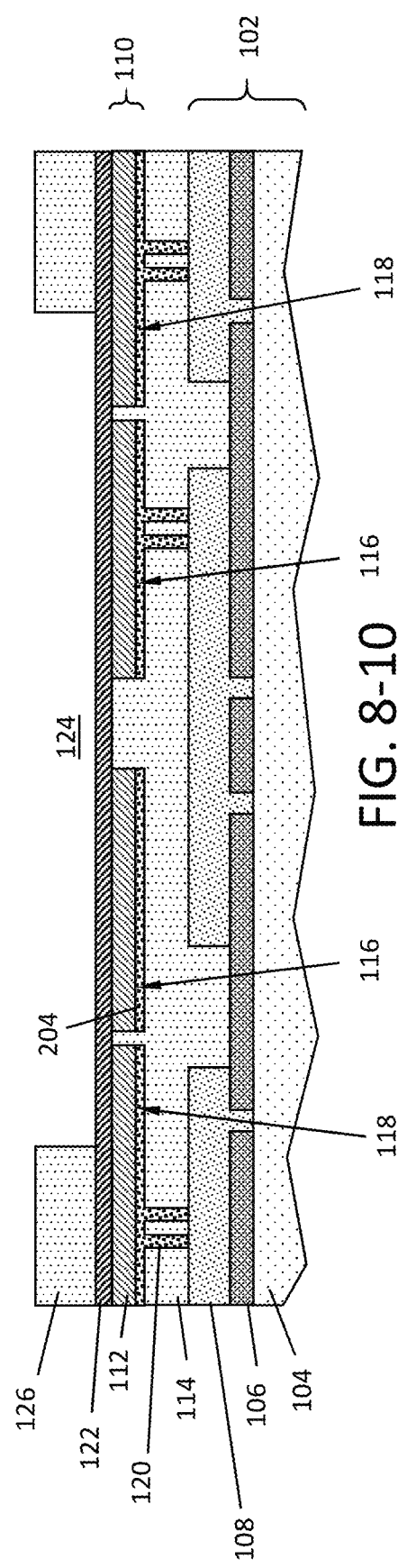

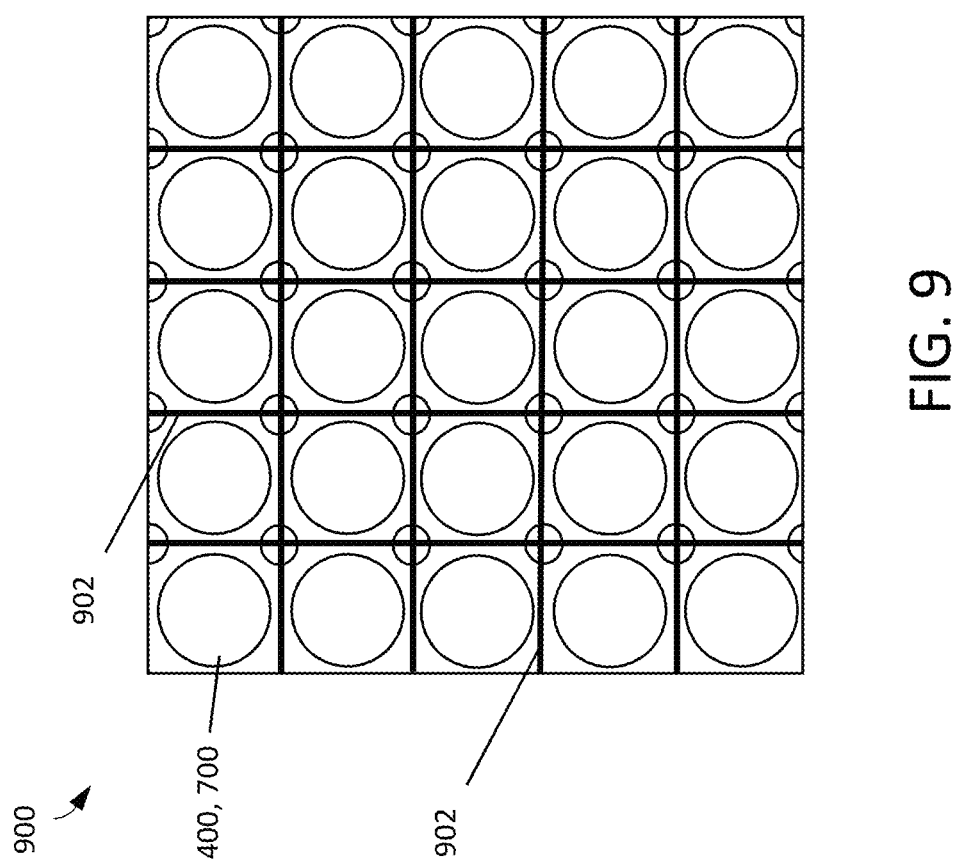

BOTTOM ELECTRODE VIA STRUCTURES FOR MICROMACHINED ULTRASONIC TRANSDUCER DEVICES

CROSS-REFERENCE TO RELATED APPLICATIONS

This application claims the benefit under 35 U.S.C. §119 (e) of U.S. Provisional Patent Application Ser. No. 62/833,625, filed Apr. 12, 2019, under Attorney Docket No. B1348.70141US00 and entitled "BOTTOM ELECTRODE VIA STRUCTURES FOR MICROMACHINED ULTRASONIC TRANSDUCER DEVICES," which is hereby incorporated herein by reference in its entirety.

BACKGROUND

The present disclosure relates generally to micromachined ultrasonic transducers and, more specifically, to bottom electrode via structures for micromachined ultrasonic transducer cavities.

Ultrasound devices may be used to perform diagnostic imaging and/or treatment, using sound waves with frequencies that are higher than those audible to humans. When pulses of ultrasound are transmitted into tissue, sound waves are reflected off the tissue with different tissues reflecting varying degrees of sound. These reflected sound waves may then be recorded and displayed as an ultrasound image to the operator. The strength (amplitude) of the sound signal and the time it takes for the wave to travel through the body provide information used to produce the ultrasound images.

Some ultrasound imaging devices may be fabricated using micromachined ultrasonic transducers, including a flexible membrane suspended above a substrate. A cavity is located between part of the substrate and the membrane, such that the combination of the substrate, cavity and membrane form a variable capacitor. When actuated by an appropriate electrical signal, the membrane generates an ultrasound signal by vibration. In response to receiving an ultrasound signal, the membrane is caused to vibrate and, as a result, generates an output electrical signal.

SUMMARY

In one aspect, an ultrasonic transducer device includes a transducer bottom electrode layer disposed over a substrate, and a plurality of vias that electrically connect the transducer bottom electrode layer with the substrate, wherein substantially an entirety of the plurality of vias are disposed directly below a footprint of the transducer cavity.

In another aspect, an ultrasonic transducer device includes a transducer bottom electrode layer disposed over a substrate, and a plurality of vias that electrically connect the transducer bottom electrode layer with the substrate. The transducer bottom electrode layer includes a first metal layer in contact with the plurality of vias and a second metal layer formed on the first metal layer, the first metal layer including a same material as the plurality of vias.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 2-1 through 2-11 are a series of cross-sectional views illustrating a process that may be used to form the transducer device of FIG. 1.

FIG. 4 is a cross-sectional view of an exemplary micromachined ultrasonic transducer device in accordance with an embodiment.

FIG. 5 is a plan view of a portion of a transducer array illustrating exemplary via locations for transducers formed in accordance with FIG. 1 and FIGS. 2-1 through 2-10.

FIG. 6 is a plan view of a portion of a transducer array illustrating exemplary via locations for transducers formed in accordance with the embodiment of FIG. 4.

FIG. 7 is a cross-sectional view of an exemplary micromachined ultrasonic transducer device in accordance with another embodiment.

FIGS. 8-1 through 8-11 are a series of cross-sectional views illustrating a process that may be used to form the transducer device of FIG. 7.

FIG. 9 is a top view of an example ultrasonic transducer device that may be formed using the via structure of FIG. 4 or FIG. 7.

DETAILED DESCRIPTION

The techniques described herein relate to bottom electrode vertical interconnect access vias (hereinafter "vias") for micromachined ultrasonic transducer (MUT) cavities. In one aspect, a novel transducer cavity array layout design groups and locates each of a plurality of the bottom electrode vias directly beneath a footprint of the associated transducer cavities. By so doing, any via planarizing process defects occurring during manufacturing may be minimized for regions outside the cavity footprints where low temperature oxide bonding actually takes place.

In another aspect, in lieu of complete removal of excess via fill material, embodiments purposely keep a continuous thin film of via fill material remaining on top of the vias themselves, thus helping to minimize or eliminate topography issues for the benefit of a downstream oxide-to-oxide transducer membrane bonding process.

Both aspects described above may provide various benefits. For example, both aspects may serve to avoid dishing when bonding wafers together.

One type of transducer suitable for use in ultrasound imaging devices is a MUT, which can be fabricated from, for example, silicon and configured to transmit and receive ultrasound energy. MUTs may include capacitive micromachined ultrasonic transducers (CMUTs) and piezoelectric micromachined ultrasonic transducers (PMUTs), both of which can offer several advantages over more conventional transducer designs such as, for example, lower manufacturing costs and fabrication times and/or increased frequency bandwidth. With respect to the CMUT device, the basic structure is a parallel plate capacitor with a rigid bottom electrode and a top electrode residing on or within a flexible membrane. Thus, a cavity is defined between the bottom and top electrodes. In some designs (such as those produced by the assignee of the present application for example), a CMUT may be directly integrated on an integrated circuit that controls the operation of the transducer. One way of manufacturing a CMUT is to bond a membrane substrate to an integrated circuit substrate, such as a complementary metal oxide semiconductor (CMOS) substrate. This may be performed at temperatures sufficiently low to prevent damage to the devices of the integrated circuit.

Figure 1:
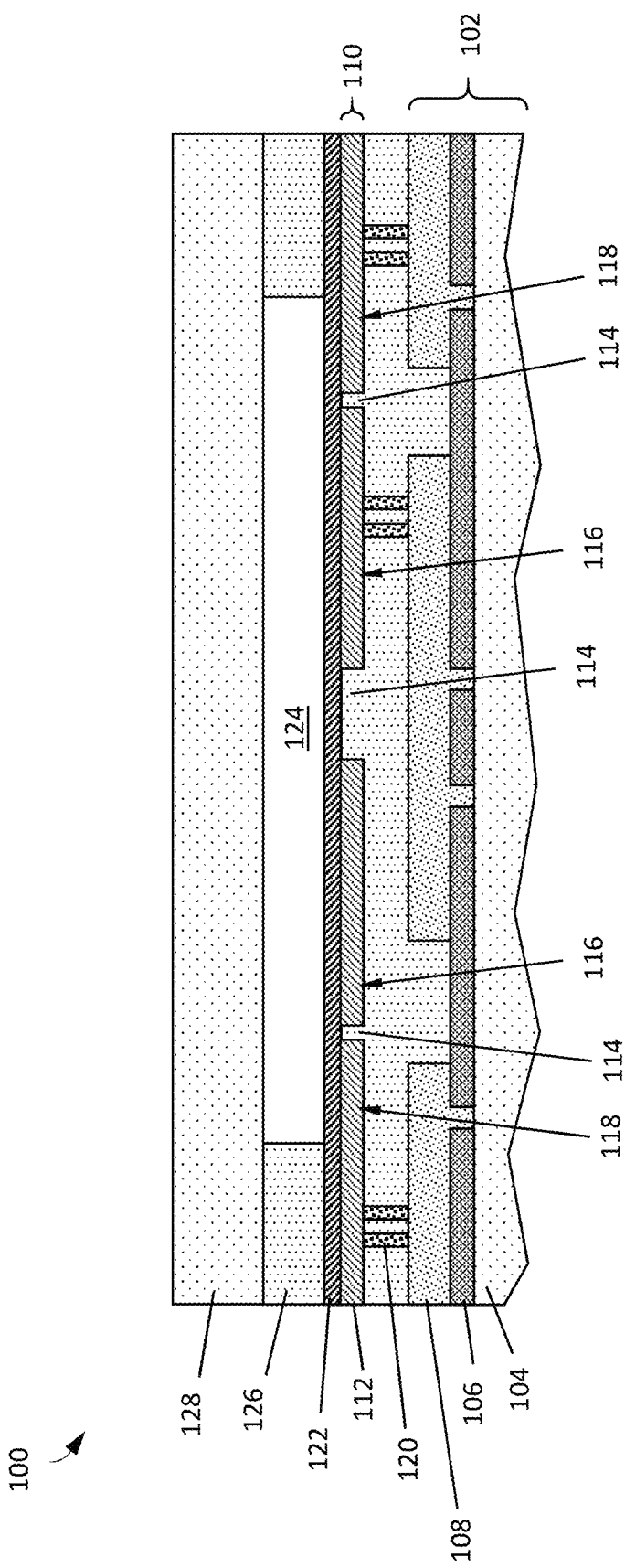
FIG. 1 is a cross-sectional view of an exemplary micromachined ultrasonic transducer device.

Referring initially now to FIG. 1, there is shown a cross-sectional view of an exemplary micromachined ultrasonic transducer device 100, such as a CMUT. The transducer device 100 includes a substrate, generally designated by 102, (e.g., a CMOS substrate, such as silicon) having one or more layers, such as for example: CMOS integrated circuits and wiring layers (at or below region 104), one more insulation/passivation layers 106, and one or more wiring redistribution layers 108. A transducer bottom electrode layer, designated generally at 110, is disposed over the substrate 102 and includes patterned regions of a metal layer 112 (e.g., titanium (Ti)), between which are located regions of an insulation layer 114 (e.g., $SiO_2$). In the illustrated example, first portions of the patterned metal layer 112 may serve as a transducer bottom electrode 116 (e.g., in a "donut" or ring configuration), while second portions of the patterned metal layer 112 may serve another function (e.g., a bypass metal structure 118). As specific substrate and transducer bottom electrode patterns are not the focus of the present disclosure, only a single example is presented in the figures. It will be appreciated, however, that the present embodiments may also be implemented in conjunction with several other transducer electrode structures including (but not limited to), for example: the aforementioned donut shaped electrode pattern (e.g., interior metal removed), multiple segment or ring electrodes, and additional metal patterns used for other purposes besides bottom electrodes (e.g., cavity getter during bonding).

Still referring to FIG. 1, electrically conductive vias 120 (e.g., tungsten (W)) electrically connect the one or more wiring redistribution layers 108 to the patterned metal layer 112 of the transducer bottom electrode layer 110. The formation and specific locations of such vias 120 is discussed in further detail below. A bottom cavity layer 122 is disposed over the transducer bottom electrode layer 110. The bottom cavity layer 122 may include, for example, a thin film layer stack including an $SiO_2$ layer deposited by chemical vapor deposition (CVD) and an aluminum oxide ($Al_2O_3$) layer deposited by atomic layer deposition (ALD). A transducer cavity 124 is defined by lithographic patterning and etching of a membrane support layer 126 that is formed on the bottom cavity layer 122. The membrane support layer 126 may be an insulating layer, such as $SiO_2$ for example, the remaining portions of which provide a support surface to which a flexible transducer membrane 128 (e.g., highly doped silicon at a concentration of about $1 \times 10^{18}$ atoms/cm$^3$ to about $1 \times 10^{19}$ atoms/cm$^3$) is bonded.

In order to preserve the integrity and functionality of the various CMOS devices residing within the substrate 102 (such as CMOS circuits and wiring layers at or below region 104), a relatively low temperature bonding process (e.g., less than about 450° C.) is employed for bonding the transducer membrane 128 to the membrane support layer 126. Accordingly, it is desirable to have a smooth bonding interface between the bonded surfaces. In one example, a surface roughness less than about 1 nanometers (nm) over a range of 100 microns (μm) may be desirable for this purpose. Thus, chemical mechanical polishing (CMP) may be used during the manufacturing process to planarize certain structures such as the metal layer 112, the insulation layer 114, and the material (e.g., W) of the vias 120 in order to provide a smooth bonding interface for downstream steps.

Figures 1, 2:
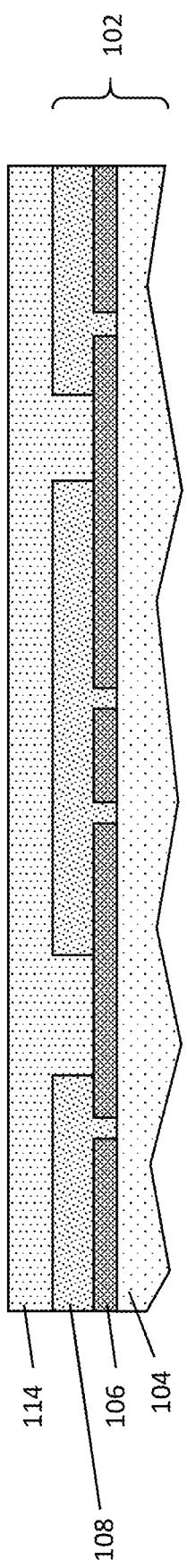
Figure 2:
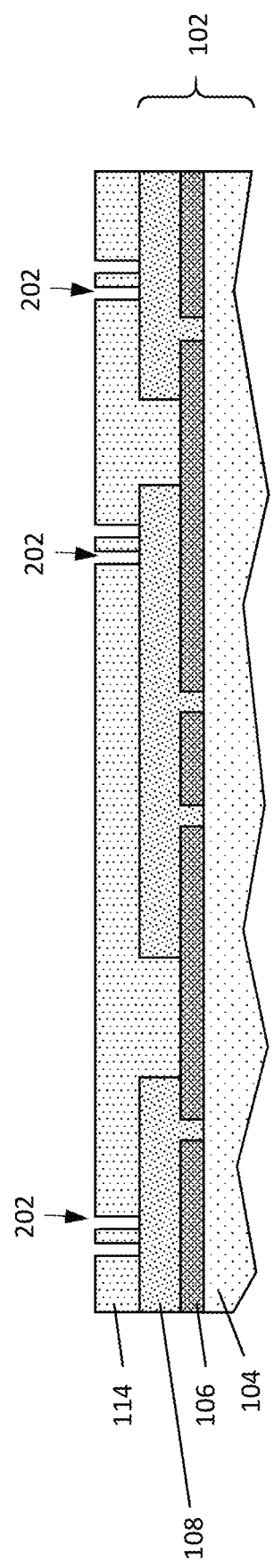
Figures 2, 3, 4, 5, 6, 7, 8, 9:
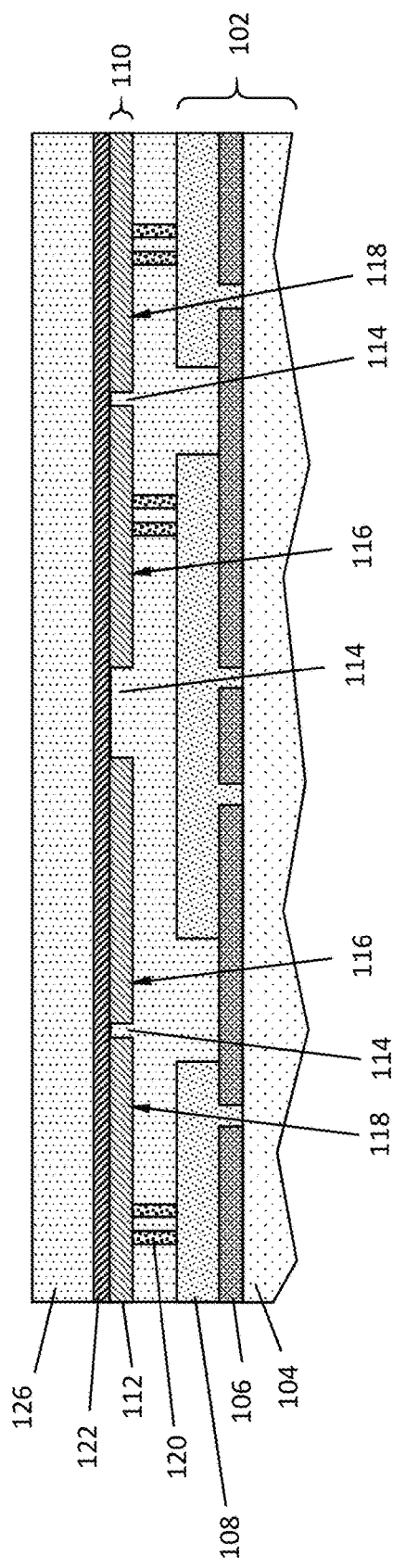
Figures 2, 3, 4, 5, 6, 7, 8, 9, 10:
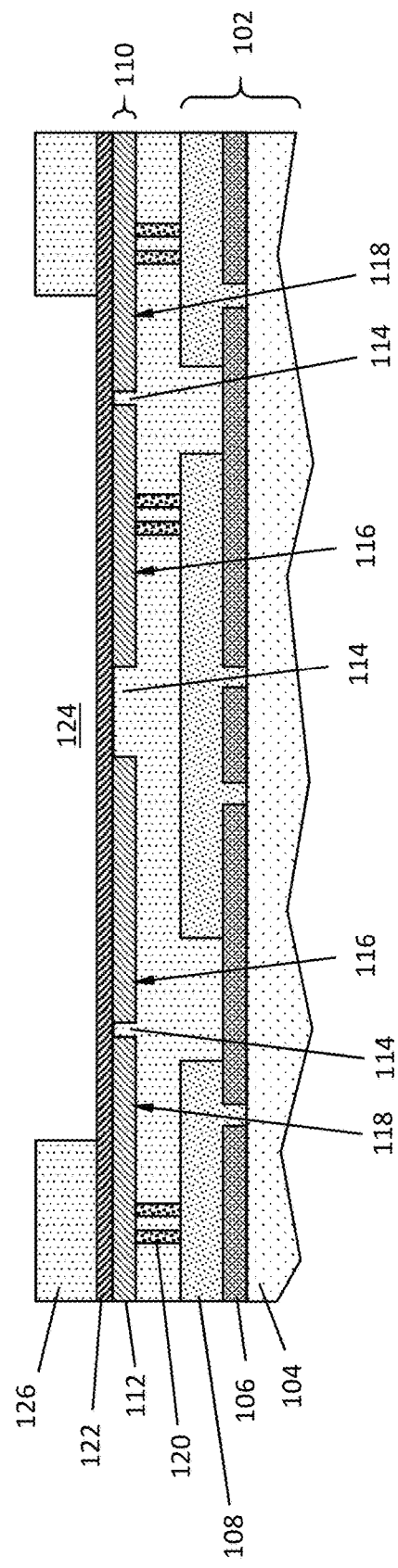
Figures 2, 3, 4, 5, 6, 7, 8, 9, 10, 11:
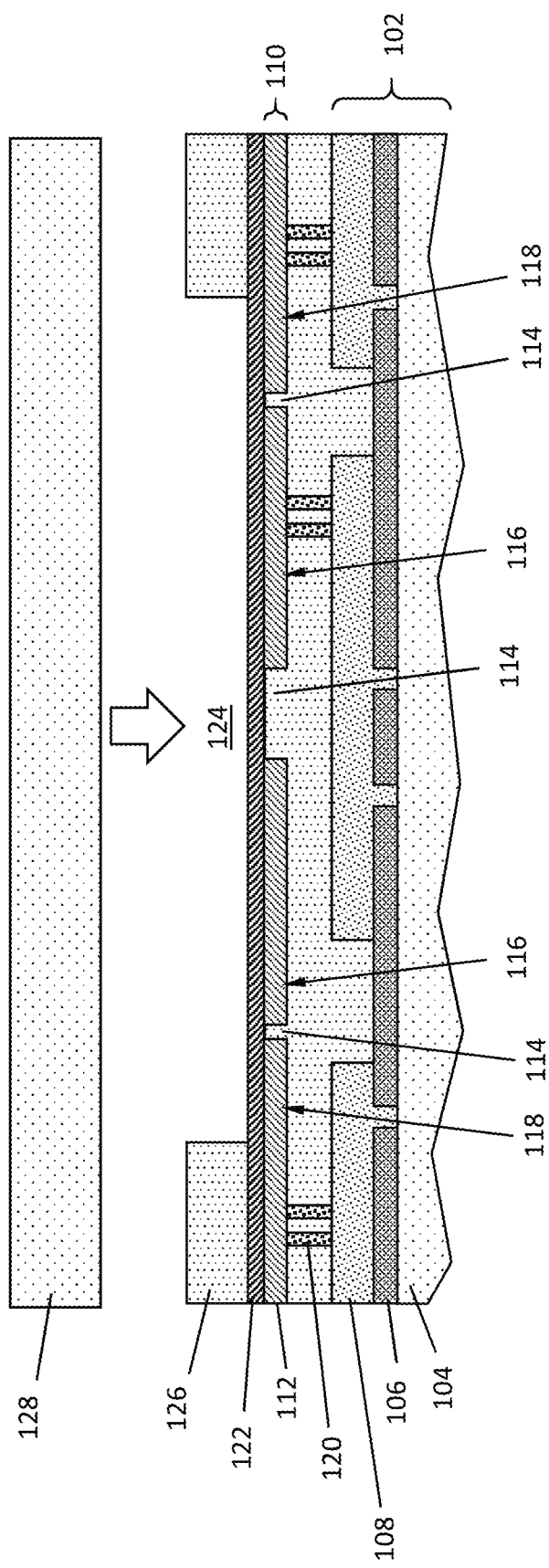

By way of further illustration, FIGS. 2-1 through 2-10 are a series of cross-sectional views illustrating a process that may be used to form the transducer device of FIG. 1 and, more specifically, the aforementioned vias 120 connecting the one or more wiring redistribution layers 108 to the transducer bottom electrode layer 110. FIG. 2-1 illustrates the CMOS substrate 102 having insulation layer 114 formed thereon. In FIG. 2-2, via openings 202 are patterned into the insulation layer using, for example a patterned photoresist material (not shown) followed by etching to access the one or more wiring redistribution layers 108. Then, as shown in FIG. 2-3, a fill material metal layer 204 such as W, for example, is formed over the patterned insulation layer 114 and via openings 202. This is followed by a planarizing operation, such chemical mechanical polishing (CMP) for example, to remove excess fill material of the metal layer 204 to the top surface of the insulation layer 114, thereby defining the vias as shown in FIG. 2-4.

In FIG. 2-5, the metal layer 112 (e.g., Ti) defining the bottom electrode layer 110 is deposited. The metal layer 112 is patterned as shown in FIG. 2-6 (such as by photoresist patterning and etching) to define the aforementioned transducer electrode and bypass metal structures 116, 118, respectively. This is followed by deposition of additional oxide material fill (e.g., the same as insulation layer 114) as shown in FIG. 2-7 and oxide planarizing as shown in FIG. 2-8. Then, in FIG. 2-9, the membrane support layer 126 is formed, followed by etching of the transducer cavity 124 in FIG. 2-10. The transducer cavity 124 may then be sealed by bonding a transducer membrane 128 to the membrane support layer 126 as illustrated in FIG. 2-11. Such a bonding operation may be, for example, a low temperature oxide-to-oxide fusing bonding process in which the transducer membrane 128 is bonded to the membrane support layer 126 at about room temperature and thereafter annealed at a temperature below about 450° C.

One of the key challenges in maintaining desired bonding integrity at such relatively low temperatures (to in turn protect CMOS circuit integrity) is to achieve a very smooth bonding interface. In the example described, the bonding interface is represented by the top surface of the membrane support layer 126 and the bottom surface of the transducer membrane 128. Such an interface desirably has a surface roughness of less than about 1 nm over a range of about 100 μm. However, certain fabrication steps may introduce surface planarization difficulties such as, for example, the via formation process depicted in part by FIG. 2-3 and FIG. 2-4. In the formation of metal via patterns, particularly when individual vias are in relatively close proximity to one another, surface planarization problems (e.g., dishing caused by erosion, or protrusion caused by oxide buffering) may occur if the CMP process is not well controlled or experiences variations/fluctuations. Any such surface planarization problems can in turn affect downstream layer formation planarity and ultimately negatively impact the transducer membrane bonding integrity.

Figure 3A:
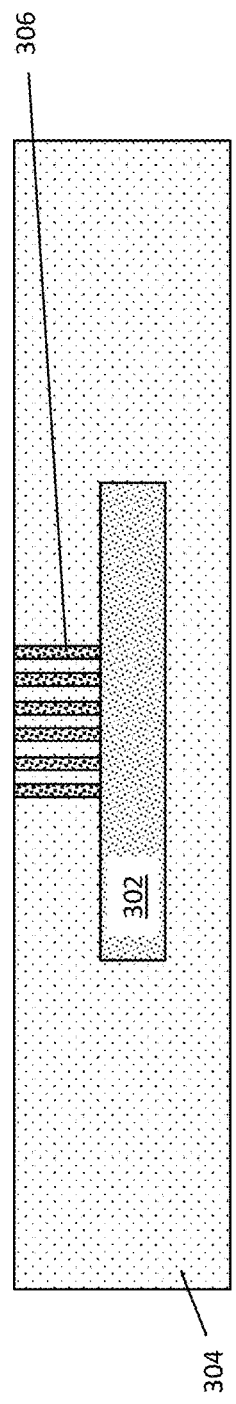
FIG. 3A is a schematic cross sectional view illustrating a desired result of a via formation operation.
Figure 3B:
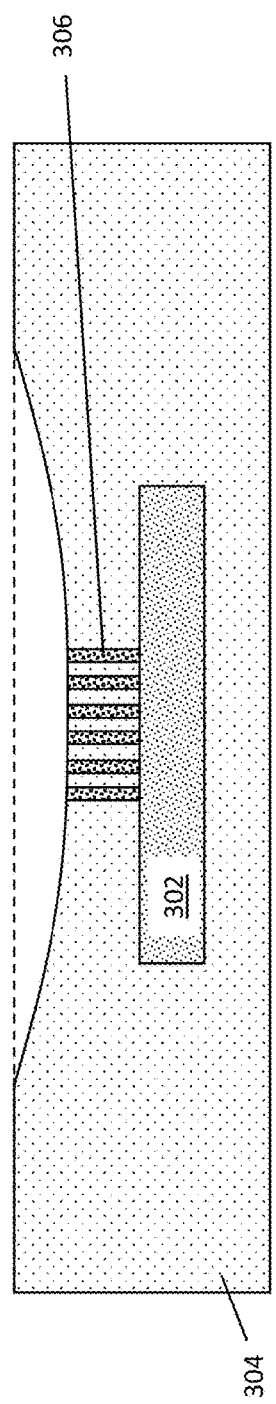
FIG. 3B is a schematic cross sectional view illustrating surface dishing as a result of a via formation operation.
Figure 3C:
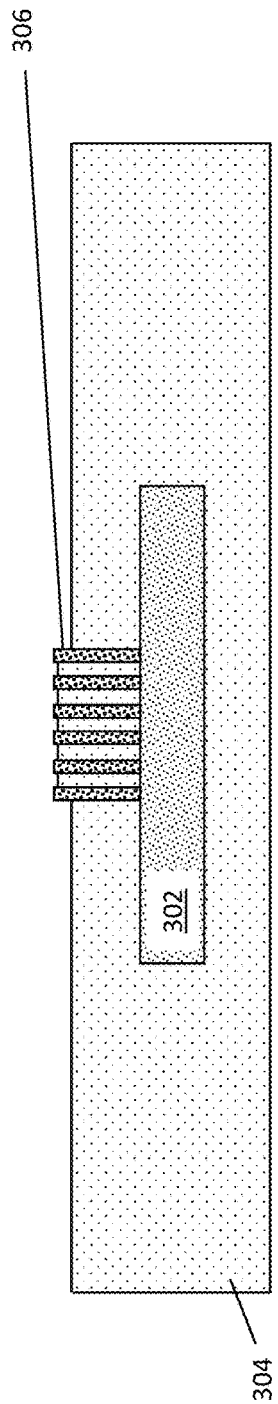
FIG. 3C is a schematic cross sectional view illustrating surface protrusion as a result of a via formation operation.
Figure 4:
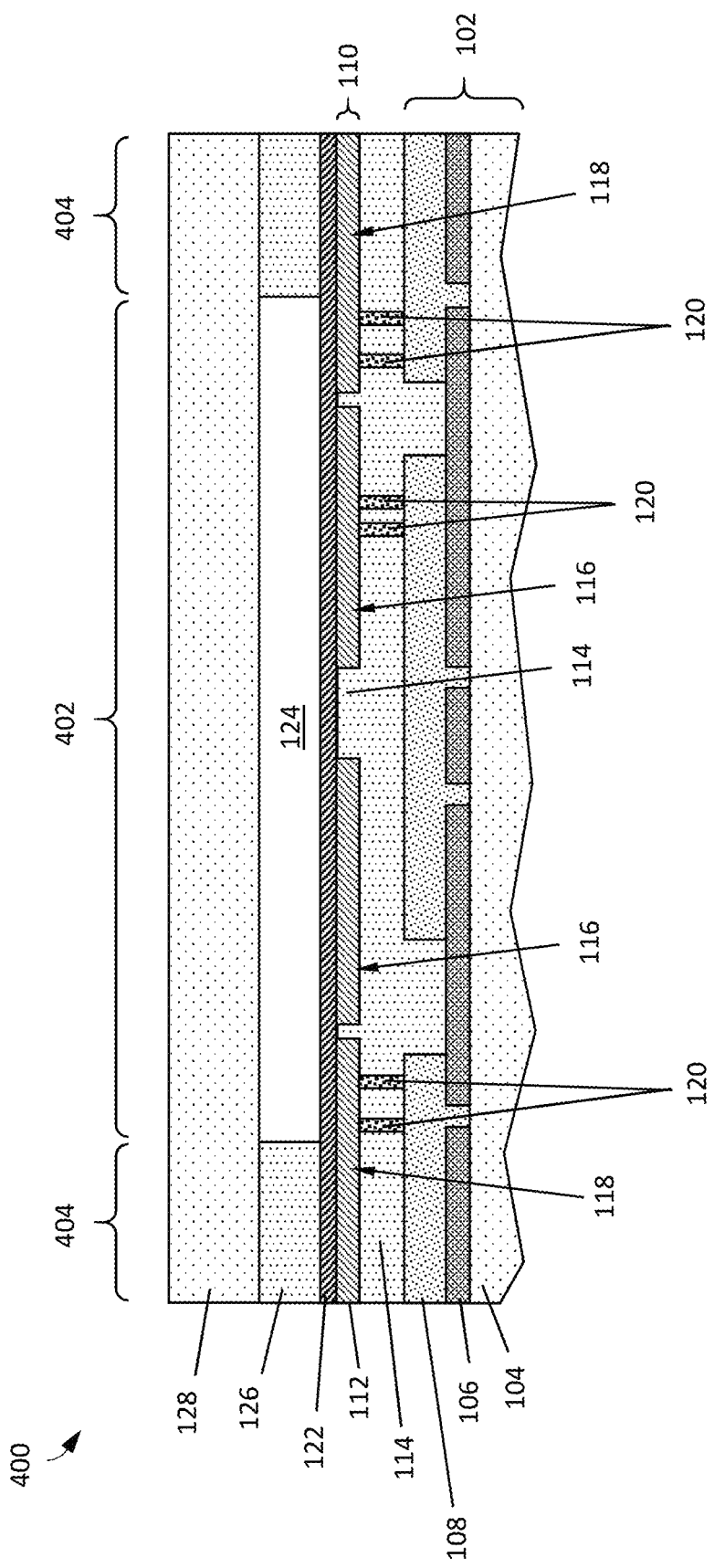
Figure 6:
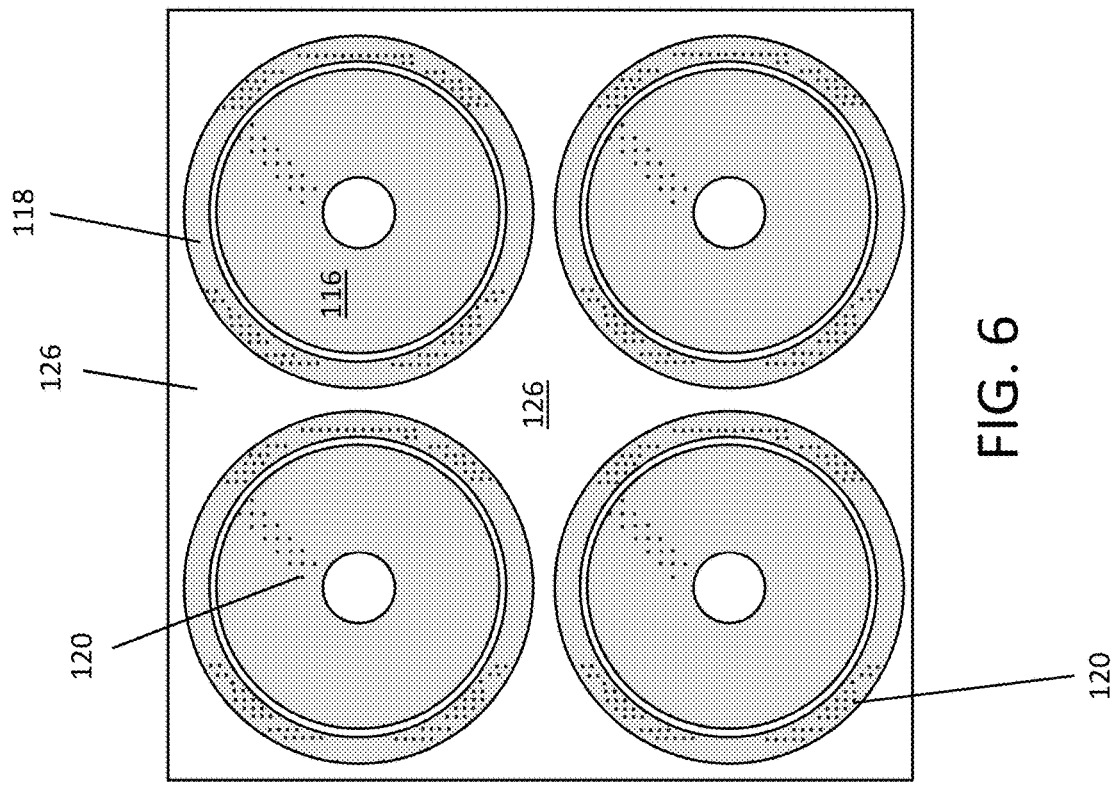
Figure 5:
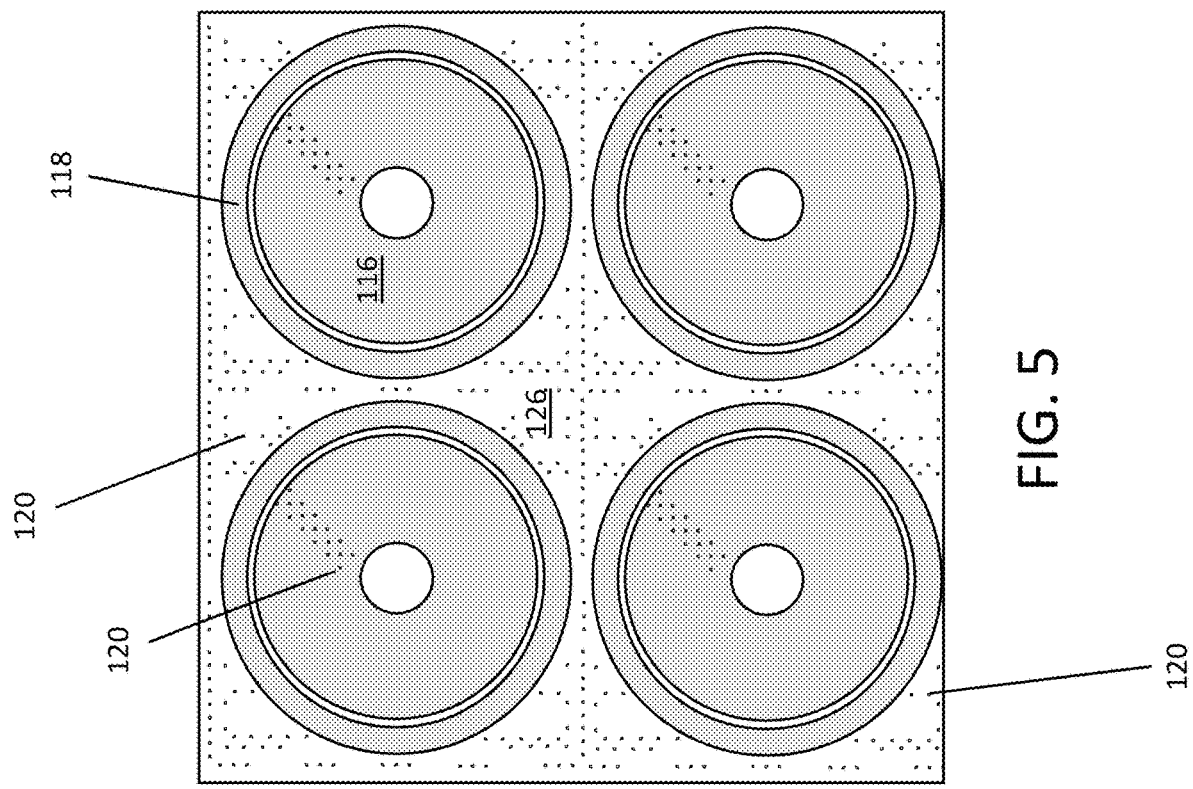
Figure 7:
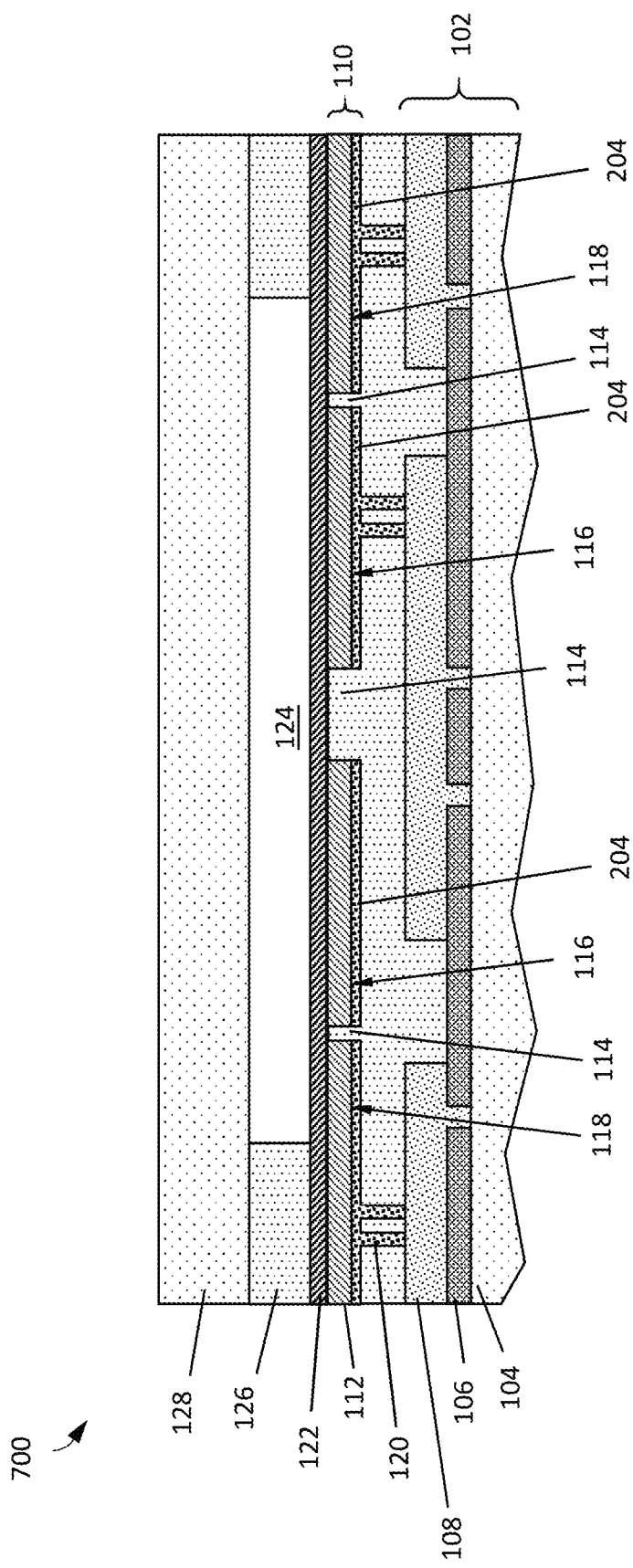
Figures 1, 8:
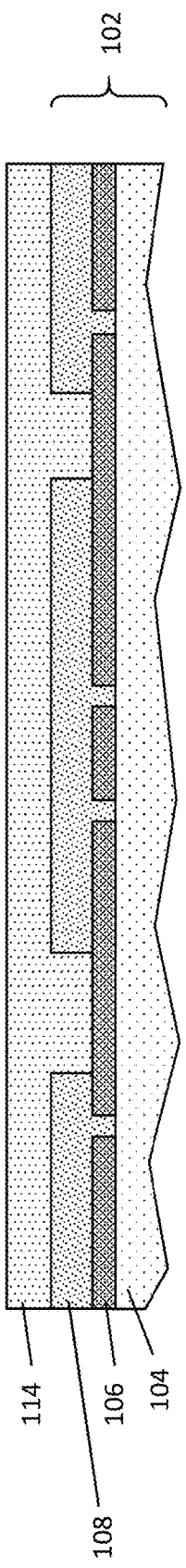
Figures 2, 8:
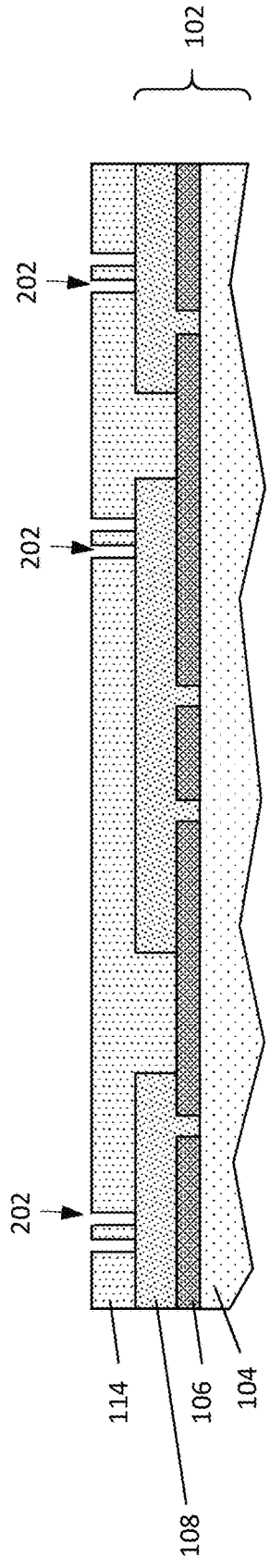
Figures 3, 8:
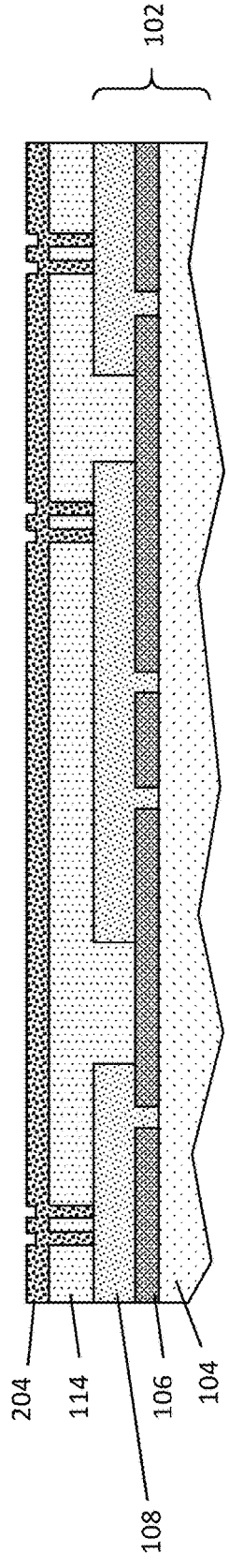
Figures 4, 8:
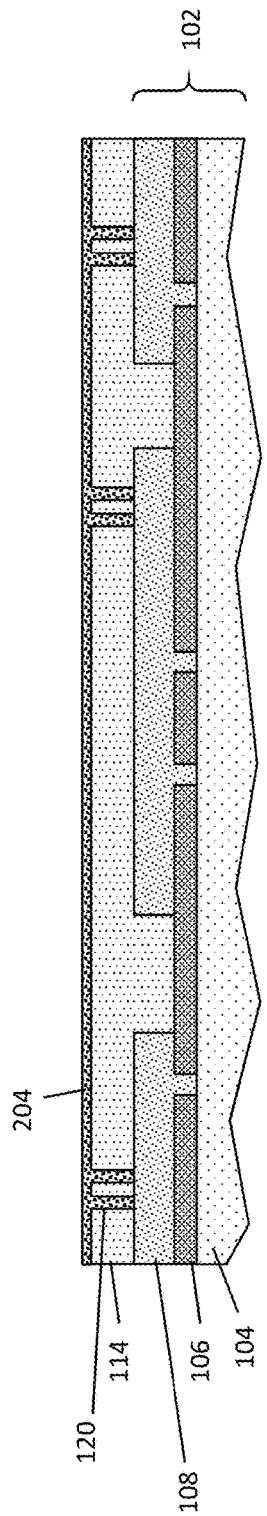
Figures 5, 8:
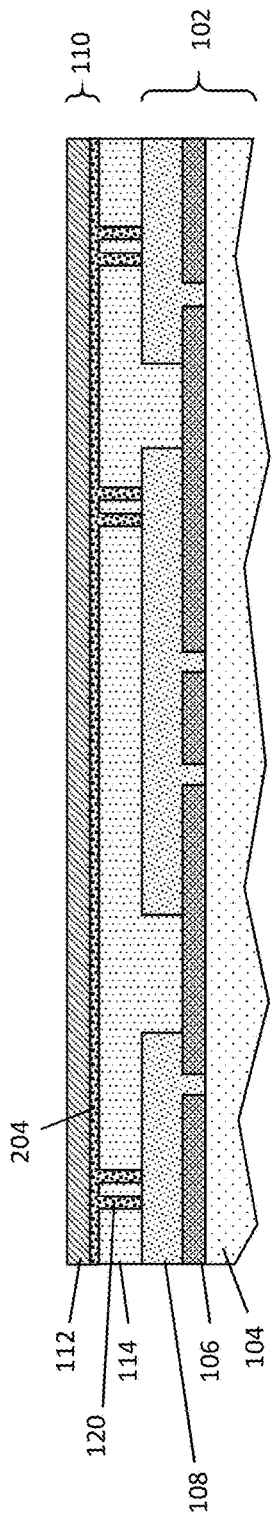
Figures 6, 8:
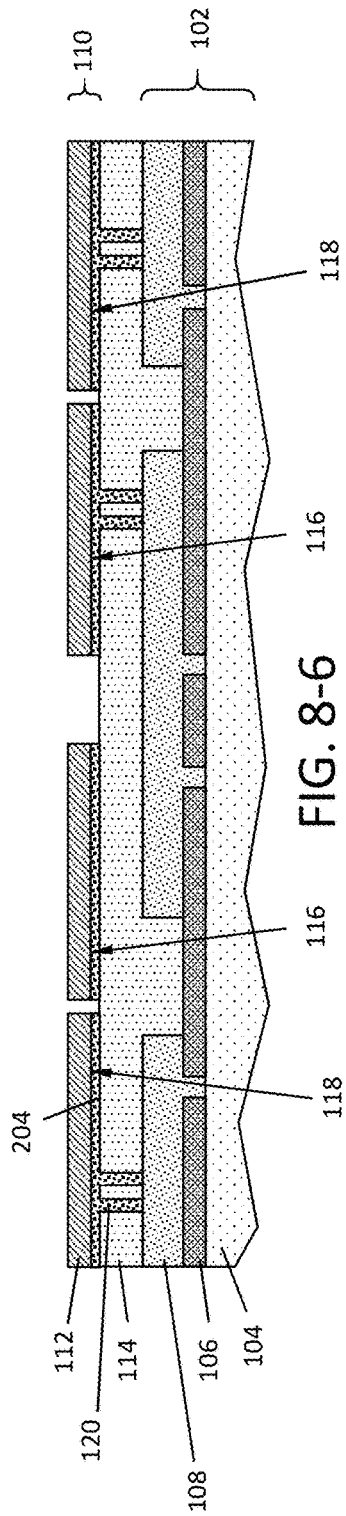
Figures 8, 9, 10, 11:
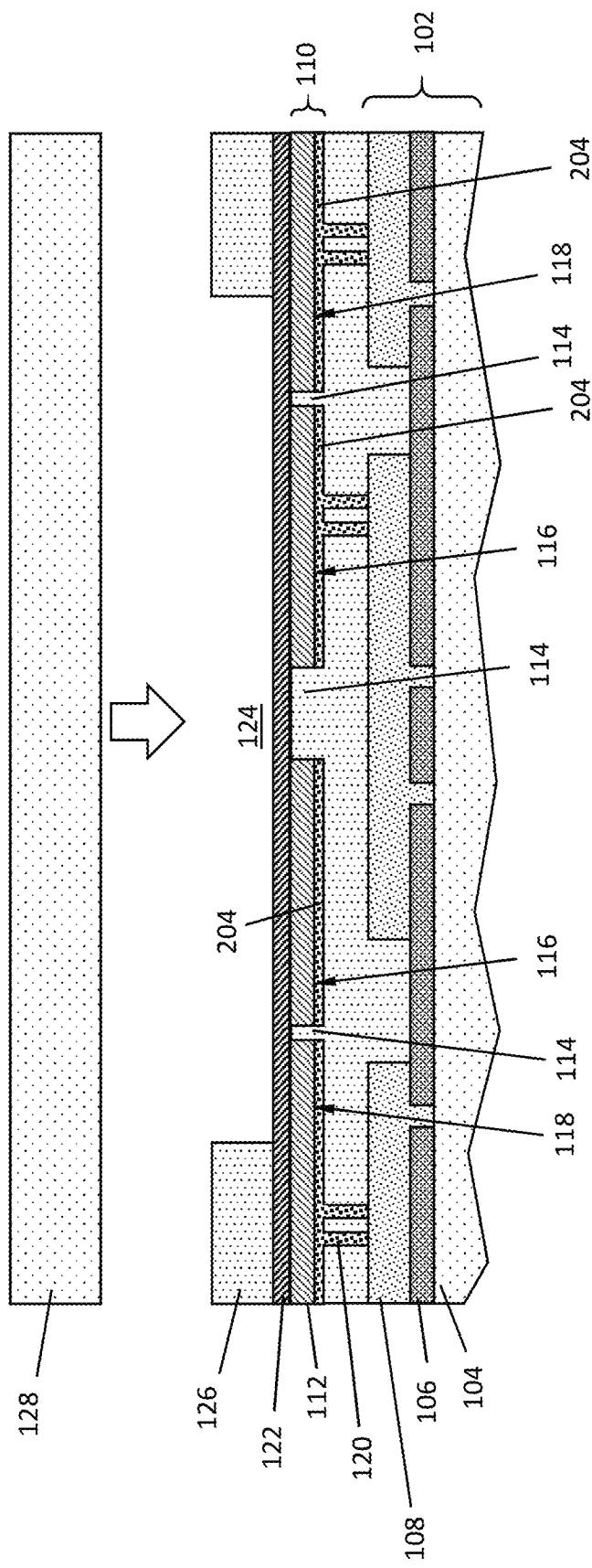

By way of further illustration, FIG. 3A is a schematic cross sectional view illustrating a desired result of a via formation operation. As shown, a lower metal layer 302 is located within an insulation layer 304. A plurality of closely spaced conductive vias 306 is also formed within the insulation layer 304, and landing on the lower metal layer 302. This simplified schematic, similar to the earlier processing operation depicted in FIG. 2-4, represents an "ideal" case of smooth surface topography in which, after a CMP operation to remove excess via material, the entire upper surface of the structure shown in FIG. 3A is substantially planar. As a practical matter, however, this may not always be the case. For example, FIG. 3B is a schematic cross sectional view illustrating surface dishing as a result of a via formation operation. As can be seen, the dishing results in the top surface of the insulating layer 304 being recessed below the dashed line, in the vicinity of the vias 306. Still another potential difficulty in via processing might be surface protrusion caused by oxide buffering, an example of which is illustrated in FIG. 3C. Here, the vias 306 and portions of the insulation layer 304 (e.g., oxide) between the vias 306, extend above remaining upper surfaces of the insulation layer 304.

In certain semiconductor fabrication operations, even where either or both of the CMP processing difficulties of FIG. 3B and FIG. 3C arise, the amount of any such planar irregularity might be perfectly acceptable for the particular structure or device being fabricated. However, for the exemplary structure and process described in FIG. 1 and FIGS. 2-1 through 2-11, these CMP issues may not be acceptable. For example, referring again to FIG. 2-4, the post-via CMP operation illustrated represents (pictorially) an acceptable or perhaps an "ideal" case of good surface planarity. On the other hand, in the event the structure of FIG. 2-4 were to suffer a condition such as shown in FIG. 3B and/or FIG. 3C, such surface planarity defect(s) could propagate to other subsequently formed layers and ultimately adversely affect the surface planarity of the top bonding surface of the patterned membrane support layer 126 (FIGS. 2-10, 2-11).

Accordingly, the inventors herein have recognized that it is desirable to reduce the impact of (and/or eliminate altogether) via planarization operations in the formation of micromachined ultrasonic transducer devices. As indicated above, in one embodiment, the patterning and location of the vias connecting the CMOS wiring redistribution layers to the transducer bottom electrode layer are selected so as to be primarily confined, aligned and/or positioned below a cavity footprint of the transducers. In this manner, any surface irregularities caused by the CMP process during via formation may have little to no impact on the surface topography of the structure in the bonding regions, thereby providing a better structural bond using low temperature processes. Alternatively, a thin film of via material may be left during CMP which can become a part of the lower transducer electrode structure, and patterned in the same fashion as the bottom transducer electrode material. As described in further detail below, this may also provide for improved device planarity for bonding at low temperatures.

Referring now to FIG. 4, there is shown a cross-sectional view of an exemplary micromachined ultrasonic transducer device 400 in accordance with an embodiment. For consistency and ease of description, like elements are designated with like reference numbers in the various figures. As will be noted from FIG. 4, the positioning and location of the vias 120 are such that they are directly beneath a footprint 402 of the transducer cavity 124. This is the case for connection to both the transducer bottom electrode structures 116 and the bypass metal structures 118 of the metal layer 112. That is, the regions 404 beyond the footprint 402 of the transducer cavity 124 do not have any of the vias 120 disposed directly below. In this manner, any difficulties associated with the formation of the vias (in terms of surface planarity as discussed above) may have little to no impact on the surface planarity of the membrane support layer 126 (i.e., the membrane bonding regions). This distinction in via location between the embodiment of FIG. 4 with the structure of FIG. 1 may be further illustrated by reference to a side-by-side comparison of FIG. 5 and FIG. 6.

Both FIG. 5 and FIG. 6 are plan views of a portion of a transducer array (4×4 in this particular example) illustrating exemplary via locations for transducers. The vias 120 in each figure are relatively small compared to other features and appear as dots. As will be noted from FIG. 5, which corresponds to the structure of FIG. 1, the vias 120 are present both below the transducer cavity footprint (denoted by the darker shaded circular regions), as well as below the bonding regions corresponding to the patterned membrane support layer 126. That is, the vias 120 in FIG. 5 are used to make an electrical connection to the transducer bottom electrode structures 116 below the cavity footprint, as well as to the bypass metal structures 118 beyond the cavity footprint (i.e., beneath the membrane support layer 126).

In contrast, FIG. 6 illustrates that each of the vias 120 that connect to the transducer bottom electrode structures 116 or to the bypass metal structures 118 are located directly beneath the cavity footprint. That is, the regions directly beneath the membrane support layer 126 are free from (or at least substantially free from) having vias located therein. Although it may be desirable to form the device such that the via patterning results in every via being located directly beneath the cavity footprint, it is conceivable as a practical matter that at least one via (or perhaps a few vias) may be misaligned due to, for example, processing variations/tolerances, such that one or more lies outside the cavity footprint. Thus, it is within the scope of the present embodiments that a percentage of bottom electrode vias may be disposed beneath the cavity footprint (e.g., greater than 99%, greater than 95%, greater than 90%, greater than 75%, greater than 50%), so long as the overall processing impact to bonding integrity is minimized. As a result, in the event where CMP processing variations exist, the disclosed via location scheme may minimize any process impact to the bonding field regions.

Referring now to FIG. 7, there is shown a cross-sectional view of an exemplary micromachined ultrasonic transducer device 700, in accordance with another embodiment. Again, for consistency and ease of description, like elements are designated with like reference numbers in FIG. 7 as in earlier described figures. As will be noted, in this embodiment, the transducer bottom electrode layer 110 also includes transducer bottom electrode structures 116 and bypass metal structures 118, with regions of the insulation layer 114 being disposed therebetween. However, in contrast with the structure of FIG. 1, the transducer bottom electrode layer 110 is defined by both a first (lower) metal layer 204 and a second (upper) metal layer 112 (e.g., Ti) formed over the first metal layer 204. In an embodiment, the first metal layer 204 is the same fill material (e.g., W) used to form the vias 120. By purposely maintaining a continuous, thin film first metal layer 204 on top of the vias 120 during the via fabrication process, the aforementioned problems associated with either surface dishing problem caused by erosion and/or surface protrusion caused by oxide buffing may therefore be avoided by providing a smooth, finished top surface. This in turn may allow for a more reliable downstream oxide-to-oxide bonding process.

With respect to an exemplary fabrication sequence for the transducer device 700, reference may now be made to FIG. 8-1 through FIG. 8-11. Since FIG. 8-1 through FIG. 8-3 are substantially similar to FIG. 2-1 through FIG. 2-3, a repeated detailed description of the same is omitted for the sake of brevity. After deposition of the fill material metal layer 204 in FIG. 8-3, the process proceeds to FIG. 8-4. As will be noted, rather than a complete CMP removal of the metal layer 204 all the way down to the insulation layer 114, a continuous thin film of the metal layer 204 is instead left remaining over the vias 120 and the insulation layer 114. In an embodiment, a CMP operation and removal of the metal layer 204 may be timed such that it is stopped prior to reaching the insulation layer 114 (and thereby avoiding adverse planarity conditions such as described in connection with FIG. 3B and/or FIG. 3C). For example, a remaining thickness of the metal layer 204 remaining over the vias 120 and the insulation layer 114 may be about 10-50 nm.

As shown in FIG. 8-5, the second (upper) metal layer 112 (e.g., Ti) is deposited over the first (lower) metal layer 204 to define the bottom electrode layer 110. Both metal layers 204, 112 are then patterned as shown in FIG. 8-6 to define the aforementioned transducer electrode and bypass metal structures 116, 118, respectively. From this point, remaining processing steps may be substantially similar to those previously described. These may include, for example, deposition of additional oxide material fill (e.g., the same as insulation layer 114) as shown in FIG. 8-7 and oxide planarizing as shown in FIG. 8-8. In FIG. 8-9, the membrane support layer 126 is formed, followed by etching of the transducer cavity 124 in FIG. 8-10. The transducer cavity 124 may then be sealed by bonding a transducer membrane 128 to the membrane support layer 126 as illustrated in FIG. 8-11.

FIG. 9 illustrates a top view of an example ultrasonic transducer device 900 formed using any of the exemplary transducer structure embodiments described herein. As illustrated, the transducer device includes an array of individual transducers 400, 700, such as those respectively described above in conjunction with FIG. 4 and FIG. 7. The specific number of transducers 400, 700 shown in FIG. 9 should not be construed in any limiting sense, and may include any number suitable for a desired imaging application, which may be for example on the order of tens, hundreds, thousands, tens of thousands or more. FIG. 9 further illustrates an example location of metal 902 that may distribute an electrical signal to the membranes (upper electrodes) of the transducers 400, 700. It should also be appreciated that although the exemplary geometric structure of this portion of the ultrasonic transducer 400, 700 is generally circular in shape, other configurations are also contemplated such as for example, rectangular, hexagonal, octagonal, and other multi-sides shapes, etc.

According to an aspect of the present application, an ultrasonic transducer device is provided, comprising: a transducer bottom electrode layer disposed over a substrate; and a plurality of vias that electrically connect the transducer bottom electrode layer with the substrate, wherein substantially an entirety of the plurality of vias are disposed directly below a footprint of a transducer cavity. In some embodiments, at least about 99% of the plurality of vias are disposed directly below a footprint of a transducer cavity. In some embodiments, at least about 90% of the plurality of vias are disposed directly below a footprint of a transducer cavity.

As will thus be appreciated, the above described embodiments, whether implemented alone or in combination with one another, may provide certain benefits such as (for example) improved process margins and wafer bonding yield. As such, they may be particularly desirable for volume manufacturing of ultrasonic transducer devices and systems incorporating such devices.

The above-described embodiments can be implemented in any of numerous ways. For example, the embodiments may be implemented using hardware, software or a combination thereof. When implemented in software, the software code can be executed on any suitable processor (e.g., a microprocessor) or collection of processors, whether provided in a single computing device or distributed among multiple computing devices. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, some aspects of the technology may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An ultrasonic transducer device, comprising:
a transducer structure, comprising:
   a transducer membrane; and
   a membrane support layer;
a transducer bottom electrode layer that is disposed over
   a substrate; and
   vias that electrically connect the transducer bottom
      electrode layer to the substrate, wherein
   the transducer bottom electrode layer comprises a first
      metal layer, that contacts to the vias and comprises a
      same material that completely fills the vias, and a
      second metal layer that overlies the first metal layer
      in a same pattern as the first metal layer.

2. The device of claim 1, wherein the first metal layer comprises tungsten (W).

3. The device of claim 2, wherein the second metal layer comprises titanium (Ti).

4. The device of claim 1, wherein the first metal layer has a thickness of about 10-50 nanometers (nm).

5. The device of claim 1, wherein
the membrane support layer supports the transducer membrane and is patterned such that a transducer cavity is disposed between the transducer membrane and the transducer bottom electrode layer, and
substantially all of the vias are disposed beneath the transducer cavity.

6. The device of claim 1, wherein the ultrasonic transducer device comprises an array of transducer structures.

7. An ultrasonic transducer device, comprising: a transducer bottom electrode layer that is disposed over a substrate; a transducer structure, comprising: a transducer membrane; and a membrane support layer that supports the transducer membrane and is patterned such that a transducer cavity is disposed between the transducer membrane and the transducer bottom electrode layer; and vias that electrically connect the transducer bottom electrode layer to the substrate, wherein substantially all of the vias are disposed beneath the transducer cavity, wherein the transducer bottom electrode layer comprises a first metal layer, that contacts the vias and comprises a same material as the vias, and a second metal layer that overlies the first metal layer in a same pattern as the first metal layer, and wherein the vias are completely filled with the same material as the first metal layer.

8. The device of claim 7, wherein the ultrasonic transducer device comprises an array of transducer structures.

* * * * *